United States Patent
Furusato et al.

(10) Patent No.: US 7,385,468 B2
(45) Date of Patent: Jun. 10, 2008

(54) SURFACE ACOUSTIC WAVE FILTER

(75) Inventors: Hiroyuki Furusato, Yokohama (JP); Osamu Kawachi, Yokohama (JP)

(73) Assignee: Fujitsu Media Devices Limited, Yokohama (JP)

( * ) Notice: Subject to any disclaimer, the term of this patent is extended or adjusted under 35 U.S.C. 154(b) by 171 days.

(21) Appl. No.: 11/019,387

(22) Filed: Dec. 23, 2004

(65) Prior Publication Data
US 2005/0140469 A1 Jun. 30, 2005

(30) Foreign Application Priority Data
Dec. 24, 2003 (JP) .............................. 2003-428288

(51) Int. Cl.
*H03H 9/64* (2006.01)
(52) U.S. Cl. .................. 333/193; 333/195; 310/313 B; 310/313 D
(58) Field of Classification Search ................. 333/193
See application file for complete search history.

(56) References Cited
U.S. PATENT DOCUMENTS
6,034,578 A * 3/2000 Fujita et al. ................ 333/193

FOREIGN PATENT DOCUMENTS

| JP | 6-224682 | | 8/1994 |
|---|---|---|---|
| JP | 8-321739 | A | 12/1996 |
| JP | 11-191720 | A | 7/1999 |
| JP | 2000-77967 | A | 3/2000 |
| JP | 2000-196408 | * | 7/2000 |
| JP | 2001-53574 | * | 2/2001 |
| JP | 2001-168672 | * | 6/2001 |
| JP | 2003-46361 | * | 2/2003 |

* cited by examiner

*Primary Examiner*—Barbara Summons
(74) *Attorney, Agent, or Firm*—Arent Fox LLP.

(57) ABSTRACT

Surface acoustic wave (SAW) filter includes SAW resonators, a discharge induction pattern is provided between a ground and at least one of a signal input terminal and a signal output terminal, and the discharge induction pattern has multiple gaps that are narrower than gaps that exist inside electrode patterns of the SAW resonators. Since the discharge induction pattern has multiple gaps that are narrower than gaps that exist inside electrode patterns of the SAW resonators, it is possible to induce the electrostatic discharge without fault. The multiple gaps are provided so as to protect the SAW resonators against multiple times of electrostatic discharge.

2 Claims, 3 Drawing Sheets

SURFACE ACOUSTIC WAVE FILTER

BACKGROUND OF THE INVENTION

1. Field of the Invention

This invention generally relates to a surface acoustic wave (hereinafter simply referred to as SAW) filter having a SAW resonator, and more particularly, to a technique for protecting the SAW filter from electrostatic discharge (referred to as ESD).

2. Description of the Related Art

In recent years, wireless devices such as mobile telephones have rapidly been downsized, highly advanced, and highly improved in quality. A high-frequency circuit of the wireless device employs the filter having the SAW resonator. The filter structure includes a ladder-type filter and a multi-mode filter. The ladder-type filter is composed of multiple SAW resonators that are connected in a ladder structure. The multi-mode filter includes a double-mode SAW filter (referred to as DMS), for example. The SAW resonator includes a pair of comb-like electrodes that face each other on a piezoelectric substrate. This comb-like electrode is referred to as interdigital transducer (IDT). The comb-like electrode includes a bus bar and multiple electrode fingers that extend from the bus bar in the same direction. Gaps between the adjacent electrode fingers and those between edges of the electrode fingers and the bus bar that face the edges are extremely small. Therefore, in the case where static electricity is applied to an input terminal or an output terminal of the SAW filter, an electrostatic discharge occurs between the above-mentioned terminal and the ground. As a result, the SAW resonator, which is arranged between the terminal and the ground, is destroyed.

Japanese Patent Application Publication No. 6-224682 (hereinafter referred to as Document 1) discloses a structure for protecting the SAW resonator that determines the filter characteristics, by providing a sacrificial electrode for electrostatic breakdown. The sacrificial electrode for electrostatic breakdown is connected to the input terminal or the output terminal so as to be broken instead of the SAW resonator, in the case where the static electricity is applied.

However, there is the problem in that once the sacrificial electrode is broken, the SAW filter cannot be protected from the static electricity any longer. As a result, the reliability gets lower.

SUMMARY OF THE INVENTION

It is a general object of the present invention to solve the above-mentioned problem and provide the SAW filter with a highly reliable measure against the static electricity.

According to an aspect of the present invention, there is provided a surface acoustic wave (SAW) filter having SAW resonators, a discharge induction pattern may be provided between a ground and at least one of a signal input terminal and a signal output terminal, and the discharge induction pattern has multiple gaps that are narrower than gaps that exist inside electrode patterns of the SAW resonators. Since the discharge induction pattern has multiple gaps that are narrower than gaps that exist inside electrode patterns of the SAW resonators, it is possible to induce the electrostatic discharge without fault. The multiple gaps are provided so as to protect the SAW resonators against multiple times of electrostatic discharge.

In the above-mentioned SAW filter, the discharge induction pattern may include the gaps having an identical size.

In the above-mentioned SAW filter, the discharge induction pattern may include the gaps having different sizes, and each of the multiple pairs of gaps has a respective size.

In the above-mentioned SAW filter, the discharge induction pattern may have pairs of sharp-pointed portions that define the gaps, and adjacent ones of the sharp-pointed portions are arranged at an interval greater than that at which adjacent finger electrodes of the SAW resonators are arranged.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1:
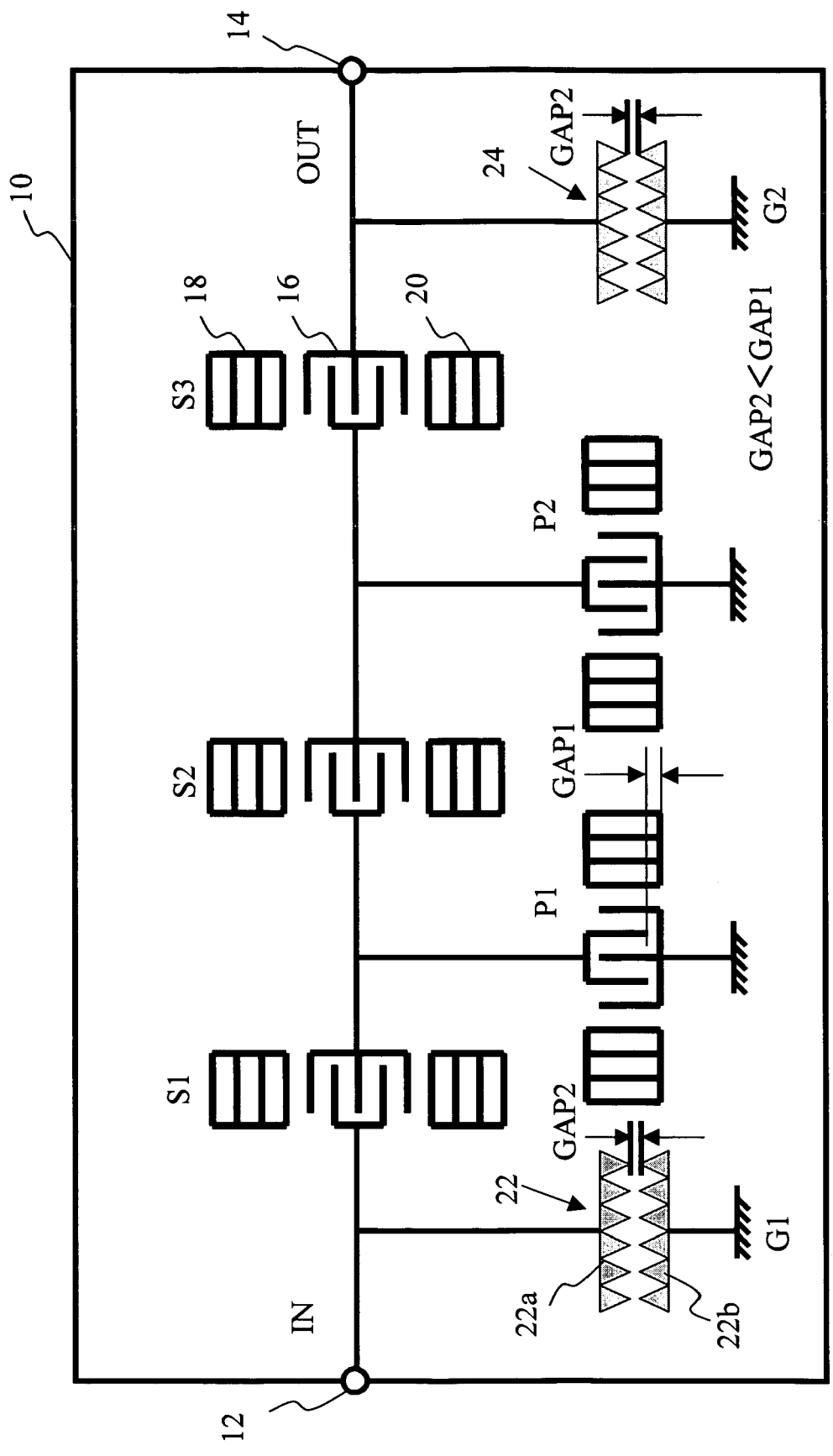
FIG. 1 shows a SAW filter in accordance with a first embodiment of the present invention.

FIG. 1 shows a SAW filter in accordance with a first embodiment of the present invention. The SAW filter includes a piezoelectric substrate 10, multiple SAW resonators S1 through S3, P1, and P2 that are provided on the piezoelectric substrate 10, a signal input terminal 12, and a signal output terminal 14. These SAW resonators are connected in the ladder structure. The piezoelectric substrate 10 is made of a piezoelectric single crystal such as lithium tantalate (LT) or lithium niobate (LN). Each of the above-mentioned SAW resonators S1 through S3, P1, and P2 includes an IDT electrode 16 and reflection electrodes 18 and 20 that are arranged on both side of a propagation direction. For simplicity of the drawing, the referential numerals 16, 18, and 20 are shown in the SAW resonator S3 only. The IDT electrode 16 includes a pair of comb-like electrodes. The SAW resonators S1 through S3 are disposed in series arms in the ladder-type structure, and the SAW resonators P1 and P2 are disposed in parallel arms. Therefore, the SAW resonators S1 through S3 are especially referred to as series-arm resonators or series-type resonators, and the SAW resonators P1 and P2 are especially referred to as parallel-arm resonators or parallel-type resonators. Hereinafter S1 through S3 are referred to as series-arm resonators, and P1 and P2 are referred to as parallel-arm resonators. The series-arm resonators S1 through S3 and the parallel-arm resonators P1 and P2 determine the filter characteristics. The SAW filter as shown in FIG. 1 serves as a bandpass filter.

In accordance with the first embodiment of the present invention, the SAW filter includes discharge induction patterns 22 and 24. The discharge induction pattern 22, which has multiple gaps GAP2, is arranged between the signal input terminal 12 and a ground G1. The discharge induction pattern 24, which has multiple gaps GAP2, is arranged between the signal output terminal 14 and a ground G2. The GAP2 is narrower than a GAP1 that exists in each of the electrode patterns of the SAW resonators S1 through S3, P1, and P2. The GAP2 is narrower than the GAP1, and the discharge induction pattern 22 induces the discharge caused by the static electricity applied to the signal input terminal 12. This prevents the SAW resonators S1 through S3, P1, and P2 from being broken by the discharge. In the same manner, the discharge induction pattern 24 induces the discharge caused by the static electricity applied to the signal output terminal 14. This prevents the SAW resonators S1 through S3, P1, and P2 from being broken by the discharge. Here, the gap that exists in the electrode pattern is formed not only in the above-mentioned GAP1 but also between alternately interleaved electrode fingers. The first embodiment of the present invention is applied to the case where GAP2 is narrower than the gap between the electrode fingers. Therefore, GAP1>GAP2 is satisfied.

Figure 2:
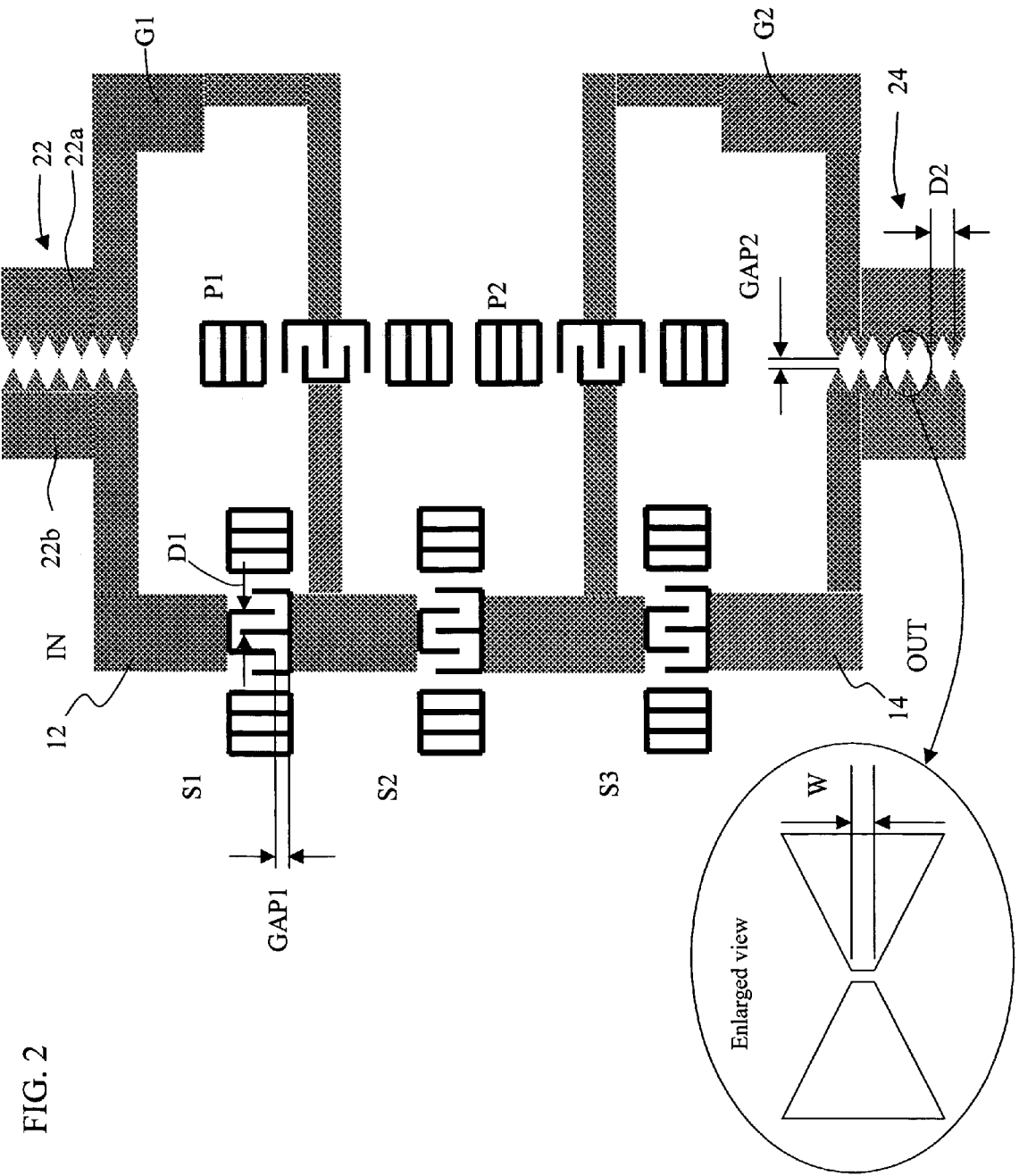
FIG. 2 is a top view of the SAW filter shown in FIG. 1.

FIG. 2 is a top view of the SAW filter shown in FIG. 1. The whole page corresponds to the piezoelectric substrate 10. The discharge induction pattern 22 includes electrodes 22a and 22b. The electrodes 22a and 22b face each other, and are formed to be included in an interconnection pattern. The electrodes 22a and 22b respectively include multiple sharp-pointed portions. The sharp-pointed portions of the electrode 22a and those of the electrode 22b face each other through the GAP2. The discharge induction pattern 24 has the same structure as that of the discharge induction pattern 22. As far as the GAP1> the GAP2 is satisfied, the GAP2 of the discharge induction pattern 22 and the GAP2 of the discharge induction pattern 24 may have the same size or may have different sizes. The GAP1 as shown in FIGS. 1 and 2 denotes the minimum gap between electrode ends of the respective SAW resonators S1 through S3, P1, and P2 and bus bars that respectively face the electrode ends of the above-mentioned resonators. Here, there is another case where the electrode ends of the respective SAW resonators face the electrode fingers that extend from the above-mentioned bus bars, instead of facing the bus bars. In this case, the GAP1 denotes the minimum gap between the electrode finger ends that face each other.

The adjacent sharp-pointed portions are arranged at an interval (pitch) D2, which may be sufficiently greater than the GAP2. In addition, preferably, the interval D2 is sufficiently greater than a gap D1, for example, 10 times or more. The gap D1 is the distance between the electrode finger ends of the SAW resonators S1 through S3, P1, and P2. This makes it possible to surely induce the electrostatic discharge to the discharge induction patterns 22 and 24, and also makes it possible to cause the electrostatic discharge at only one of the gaps GAP2. Thus, The electrostatic discharge may break only one pair of the sharp-pointed portions, and the other gaps GAP2 remain unbroken. The discharge induction patterns 22 and 24 in FIGS. 1 and 2 respectively include six gaps GAP2. Thus, even if the electrostatic discharge that can break a pair of the sharp-pointed portions is induced six times, it is possible to protect the SAW resonators S1 through S3, P1, and P2. It is thus possible to realize the highly reliable measure against the static electricity.

Taking an example of dimensions, GAP1 (the length of GAP1) is equal to 1.5 μm, GAP2 (the length of GAP2) is equal to 0.35 μm, D1 is equal to 1.0 μm, D2 is equal to 10 μm, and a width W of the sharp-pointed portion is equal to 0.35 μm.

Additionally, one of the discharge induction patterns 22 and 24 may be omitted. There is a case where it is sufficient if the measure against the static electricity is taken to one of the signal input terminal 12 and the signal output terminal 14, according to the usage. Further, the number of the gaps is not limited to six, an arbitrary number of gaps, which is at least two, may be employed. The gaps in the discharge induction pattern 22 and that of the discharge induction pattern 24 may have the same number or may have different numbers.

Second Embodiment

Figures 3A, 3B:
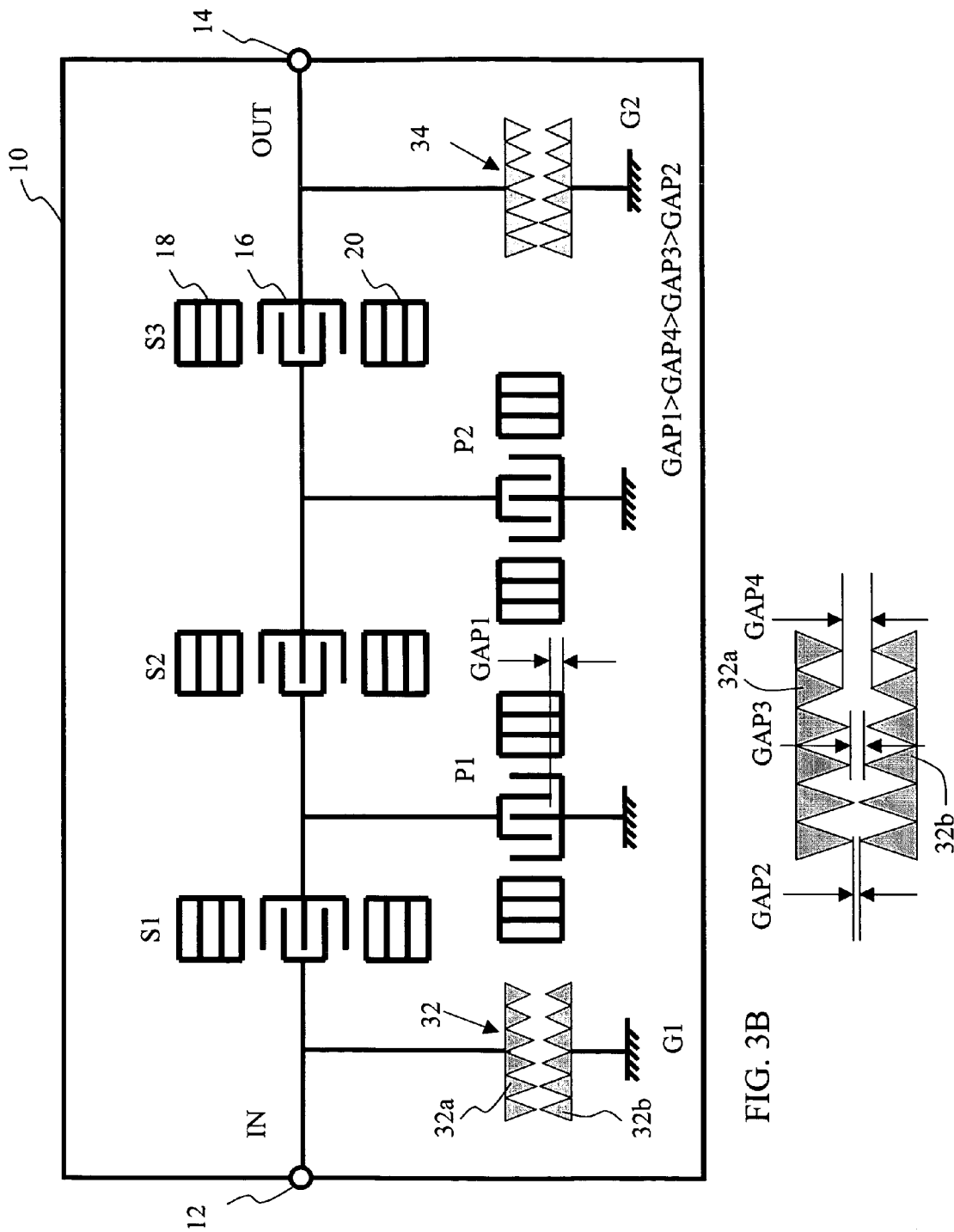
FIGS. 3A and 3B show the SAW filter in accordance with a second embodiment of the present invention.

FIGS. 3A and 3B show the SAW filter in accordance with a second embodiment of the present invention. FIG. 3A is a block diagram of the entire SAW filter. FIG. 3B shows an enlarged view of the discharge induction pattern. The SAW filter includes discharge induction patterns 32 and 34 in accordance with the second embodiment of the present invention. The discharge induction pattern 32 is arranged between the signal input terminal 12 and the ground G1. The discharge induction pattern 34 is arranged between the signal output terminal 14 and the ground G2. The discharge induction pattern 32 includes a pair of electrodes 32a and 32b that face each other. The electrodes 32a and 32b respectively include multiple sharp-pointed portions. The discharge induction pattern 32 includes multiple gaps having different sizes, which is different from the gaps in accordance with the first embodiment of the present invention. The discharge induction pattern 32 includes three different gaps, GAP2, GAP3, and GAP4, as shown in FIG. 3. As to the sizes of the above-mentioned gaps, GAP4>GAP3>GAP2 is satisfied. These gaps are narrower than those of the SAW resonators S1 through S3, P1, and P2. GAP1>GAP4>GAP3>GAP2 is satisfied. By providing different gaps, it is possible to induce the electrostatic discharge in order of the gap starting from the narrowest one. It is thus possible to prevent multiple gaps from being broken simultaneously once the static electricity is discharged, and thereby to realize the highly reliable measure against the static electricity. As shown in FIG. 3B, the discharge induction pattern 32 includes six pairs of the sharp-pointed portions. Two pairs of the six pairs of the sharp-pointed portions form GAP2, and another two pairs form GAP3, and the remaining two pairs form GAP4. Instead of the above-mentioned configuration, all the gaps may have different sizes. The number of the gaps having different sizes is not limited to three, and the number of the gaps may have two or four or more.

The discharge induction pattern 34 has the same configuration as that of the discharge induction pattern 32. However, the discharge induction patterns 32 and 34 may not be identical, and the sizes of the gap, the number of the gaps, the types of the gap, and the number of the gaps included in a pair of gaps may be different.

The present invention has been described. In accordance with the first and second embodiments of the present invention, the discharge induction pattern is provided for the ladder-type structure. The discharge induction patterns 22 and 24, 32 and 34, or a variation thereof may be provided for the multi-mode or other arbitrary structures.

The present invention is not limited to the above-mentioned embodiments, and other embodiments, variations and modifications may be made without departing from the scope of the present invention.

The present invention is based on Japanese Patent Application No. 2003-428288 filed on Dec. 24, 2003, the entire disclosure of which is hereby incorporated by reference.

What is claimed is:

1. A surface acoustic wave (SAW) filter having SAW resonators, wherein:
 a discharge induction pattern is provided between a ground and at least one of a signal input terminal and a signal output terminal;
 the discharge induction pattern has pairs of sharp-pointed portions that define multiple gaps that are narrower than gaps that exist inside electrode patterns of the SAW resonators;
 the discharge induction pattern includes multiple pairs of gaps; and
 each of the multiple pairs of gaps has a different size.

2. The surface acoustic wave (SAW) filter as claimed claim 1, wherein:
 adjacent ones of the sharp-pointed portions are arranged at an interval greater than that at which adjacent finger electrodes of the SAW resonators are arranged.

* * * * *